United States Patent
Motoyama et al.

(10) Patent No.: US 10,361,119 B1
(45) Date of Patent: Jul. 23, 2019

(54) ENLARGED CONTACT AREA STRUCTURE USING NOBLE METAL CAP AND NOBLE METAL LINER

(71) Applicant: INTERNATIONAL BUSINESS MACHINES CORPORATION, Armonk, NY (US)

(72) Inventors: Koichi Motoyama, Clifton Park, NY (US); Chih-Chao Yang, Glenmont, NY (US); James J. Kelly, Schenectady, NY (US); Cornelius Brown Peethala, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/966,695

(22) Filed: Apr. 30, 2018

(51) Int. Cl.
*H01L 21/768* (2006.01)
*H01L 23/522* (2006.01)
*H01L 23/532* (2006.01)

(52) U.S. Cl.
CPC .. *H01L 21/76843* (2013.01); *H01L 21/76805* (2013.01); *H01L 21/76807* (2013.01); *H01L 21/76862* (2013.01); *H01L 21/76873* (2013.01); *H01L 21/76876* (2013.01); *H01L 21/76879* (2013.01); *H01L 23/5226* (2013.01); *H01L 23/53228* (2013.01)

(58) Field of Classification Search
CPC ......... H01L 21/76843; H01L 21/76873; H01L 23/5226; H01L 21/76807; H01L 21/76805; H01L 21/76879; H01L 21/76862; H01L 21/76876; H01L 23/53228
See application file for complete search history.

(56) References Cited

U.S. PATENT DOCUMENTS

| | | | |
|---|---|---|---|
| 6,169,010 B1* | 1/2001 | Higashi | H01L 21/76805 257/306 |
| 6,492,262 B2 | 12/2002 | Uzoh | |
| 7,332,428 B2 | 2/2008 | Beck | |
| 7,446,036 B1* | 11/2008 | Bolom | H01L 21/76805 257/E21.585 |
| 7,790,599 B2 | 9/2010 | Yang et al. | |
| 8,058,728 B2 | 11/2011 | Ishizaka et al. | |
| 8,642,472 B2 | 2/2014 | Furuya | |
| 9,640,434 B2 | 5/2017 | Lin | |
| 2004/0238961 A1* | 12/2004 | Cunningham | H01L 21/76805 257/758 |
| 2006/0205204 A1 | 9/2006 | Beck | |
| 2008/0012142 A1* | 1/2008 | Mehta | H01L 21/76802 257/762 |
| 2008/0203570 A1* | 8/2008 | Edelstein | H01L 21/76805 257/751 |

(Continued)

*Primary Examiner* — Victor A Mandala
(74) *Attorney, Agent, or Firm* — Tutunjian & Bitetto, P.C.; Vazken Alexanian

(57) ABSTRACT

A method is presented for forming an enlarged contact area. The method includes forming a trench for receiving a first conductive material, forming a noble metal cap over a portion of the first conductive material, forming a dielectric capping layer over the noble metal cap, etching a portion of the first conductive material to create a via anchoring structure and an undercut region exposing a bottom surface of the noble metal cap, and depositing a plurality of liners such that one liner of the plurality of liners directly contacts an entirety of the exposed bottom surface of the noble metal cap.

20 Claims, 3 Drawing Sheets

(56) References Cited

U.S. PATENT DOCUMENTS

| | | | | |
|---|---|---|---|---|
| 2008/0254624 A1* | 10/2008 | Yang | ............ | H01L 21/76805 |
| | | | | 438/687 |
| 2009/0079077 A1 | 3/2009 | Yang et al. | | |
| 2009/0218691 A1* | 9/2009 | Yang | ............ | H01L 21/76805 |
| | | | | 257/751 |
| 2009/0280636 A1* | 11/2009 | Hsu | ............ | H01L 21/76825 |
| | | | | 438/618 |
| 2009/0309226 A1* | 12/2009 | Horak | ............ | H01L 21/76805 |
| | | | | 257/762 |
| 2015/0228793 A1* | 8/2015 | Chen | ............ | H01L 29/7851 |
| | | | | 257/401 |

* cited by examiner

US 10,361,119 B1

ENLARGED CONTACT AREA STRUCTURE USING NOBLE METAL CAP AND NOBLE METAL LINER

BACKGROUND

Technical Field

The present invention relates generally to semiconductor devices, and more specifically, to forming an enlarged contact area structure using a noble metal cap and a noble metal liner.

Description of the Related Art

Semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. Within a typical interconnect structure, metal vias run perpendicular to the semiconductor substrate and metal lines run parallel to the semiconductor substrate. As millions and millions of devices and circuits are squeezed on a semiconductor chip, the wiring density and the number of metal levels are both increased generation after generation.

SUMMARY

In accordance with an embodiment, a method is provided for forming an enlarged contact area. The method includes forming a trench for receiving a first conductive material, forming a noble metal cap over a portion of the first conductive material, forming a dielectric capping layer over the noble metal cap, etching a portion of the first conductive material to create a via anchoring structure and an undercut region exposing a bottom surface of the noble metal cap, and depositing a plurality of liners such that one liner of the plurality of liners directly contacts an entirety of the exposed bottom surface of the noble metal cap.

In accordance with an embodiment, a method is provided for forming an enlarged contact area. The method includes depositing a first conductive material within a barrier layer, forming a ruthenium (Ru) cap over a portion of the first conductive material, etching a portion of the first conductive material, creating a via anchoring structure and an undercut region exposing a bottom surface of the noble metal cap, and depositing a plurality of liners such at least one liner of the plurality of liners directly contacts the exposed bottom surface of the noble metal cap such that plating current flows through the plurality of liners.

In accordance with another embodiment, a semiconductor device for forming an enlarged contact area is provided. The semiconductor device includes a first conductive material deposited within a barrier layer, a noble metal cap disposed over a portion of the first conductive material, a via anchoring structure created by etching a portion of the first conductive material, an undercut region defined under the noble metal cap, the undercut region exposing a bottom surface of the noble metal cap, and a plurality of liners deposited such at least one liner of the plurality of liners directly contacts the exposed bottom surface of the noble metal cap.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
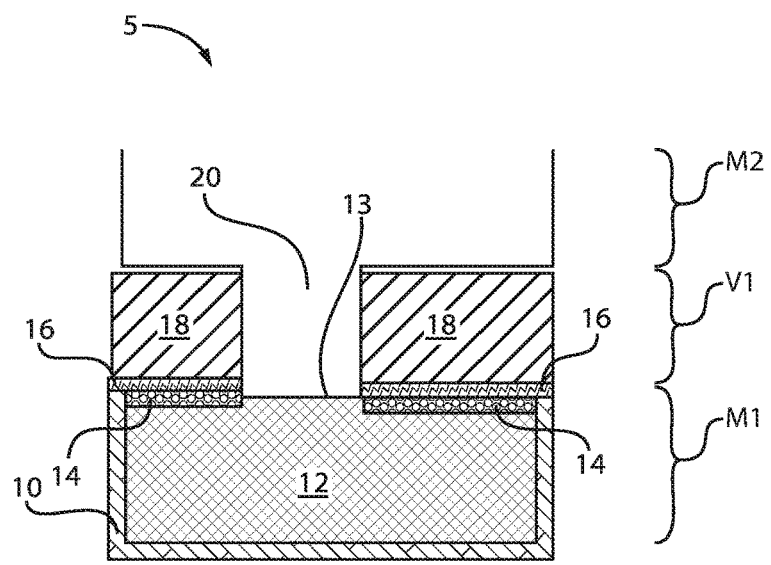
FIG. 1 is a cross-sectional view of a semiconductor structure including a noble metal cap formed over a portion of a metal-filled trench, in accordance with an embodiment of the present invention.

Embodiments in accordance with the present invention provide methods and devices for creating a via anchoring structure to reduce resistance and improve device performance. As more and more devices and circuits are squeezed on a semiconductor chip, wiring density and a number of metal levels are both increased generation after generation. To provide low resistance-capacitance (RC) for high signal speed, low-k dielectric materials having a dielectric constant of less than silicon dioxide are preferred and high conduction lines are needed. The quality of thin metal wirings and studs formed by a conventional damascene process is important to ensure yield and reliability. However, poor mechanical integrity of deep submicron metal studs embedded in low-k dielectric materials can cause unsatisfied thermal cycling and stress migration resistance in interconnect structures.

A via punch-through provides a via gouging feature (or anchoring area) within the interconnect structure. Such a via gouging feature can achieve an acceptable contact resistance as well as an increased mechanical strength of a contact stud. However, argon (Ar) sputtering (or other physical gaseous bombardment process) can create via gouging features and not only remove the deposited liner material from the trench bottom, but also damage the low-k dielectric material, specifically at the bottom of a line opening. In other words, a profile-damaged region can be created in the dielectric material at the bottom of the line opening during formation of the via gouging feature. Thus, damage can be found in the low-k dielectric material from the Ar sputtering process because of the need to create the gouging feature.

Embodiments in accordance with the present invention provide methods and devices for a dual damascene structure with an enlarged contact area between the via and an underlying metal line without creating any voids and without any damage to the low-k dielectric material. The dual damascene structure with an enlarged contact area can be achieved by employing a noble metal cap over the metal line or metal regions. The metal line or metal region can include copper (Cu) or other suitable metals or metal alloys.

Embodiments in accordance with the present invention provide methods and devices for an interconnect structure including a gouging feature at the bottom of the via openings and a method of forming the same, which minimizes damage caused by argon (Ar) sputtering into the dielectric material. This can be achieved by employing a noble metal cap, such as a ruthenium (Ru) cap, for the underlying metal region and the undercut area, thus resulting in a complete metal fill. Noble metals that can be employed for forming the noble metal cap can further include at least, rhodium, palladium, silver, osmium, iridium, platinum, and gold. The noble metal cap is not etched by a wet metal recess process and the later deposited plated metal can grow on the noble metal liner.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

FIG. 1 is a cross-sectional view of a semiconductor structure including a noble metal cap formed over a portion of a metal-filled trench, in accordance with an embodiment of the present invention.

A semiconductor structure 5 includes a conductive material 12 deposited within a barrier layer 10 defining a trench.

The conductive material 12 can be, e.g., copper (Cu). In other exemplary embodiments, the conductive material or metal can be Cu, W or Al, with Cu or a Cu alloy (e.g., AlCu). The conductive material 12 can be referred to as a metal region. A top surface 13 of the metal region 12 can be exposed after formation of the via 20 described below. In the exemplary embodiment, one metal region 12 is illustrated for the sake of clarity. One skilled in the art can contemplate a plurality of metal regions 12 each defined within a respective barrier layer 10. In one example embodiment, the conductive material 12 can be deposited, for example, by electroplating, electroless plating, chemical vapor deposition (CVD), atomic layer deposition (ALD) and/or physical vapor deposition (PVD).

The barrier layer 10, which can include Ta, TaN, Ti, TiN, Ru, RuTaN, RuTa, W, WN or any other material that can serve as a barrier to prevent conductive material from diffusing therethrough, can be formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The barrier layer 10 can also include a bilayer barrier layer that includes a lower layer of a metallic nitride such as, for example, TaN and an upper metallic layer such as, for example, Ta.

The thickness of the barrier layer 10 can vary depending on the exact manner of the deposition process as well as the material employed. Usually, the barrier layer 10 has a thickness from about 4 to about 40 nm, with a thickness from about 7 to about 20 nm being more preferable.

After deposition, a conventional planarization process such as, for example, chemical mechanical polishing (CMP) can be used to provide a structure in which the barrier layer 10 and the conductive material 12 each have upper surfaces that are substantially coplanar.

A noble metal cap 14 can be formed over the metal region 12. The noble metal cap 14 can be, e.g., a ruthenium (Ru) cap. Noble metals are metals that are resistant to corrosion and oxidation in moist air. Noble metals that can be employed for forming the noble metal cap 14 include at least ruthenium, rhodium, palladium, silver, osmium, iridium, platinum, and gold.

A dielectric capping layer 16 can be formed over the noble metal cap 14. The dielectric capping layer 16 includes any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the capping layer 16 can vary depending on the technique used to form the same as well as the material make-up of the layer. In one example, the capping layer 16 can have a thickness from about 15 to about 55 nm, with a thickness from about 25 to about 45 nm being preferable. The dielectric capping layer 16 can be formed on the surface of the noble metal cap 14 by employing a deposition process such as, for example, CVD, PECVD, chemical solution deposition, or evaporation.

A dielectric material 18 can be formed over the dielectric capping layer 16. The dielectric material 18 can be, e.g., a low-k dielectric. The dielectric material 18 can include any interlevel or intralevel dielectric including inorganic dielectrics or organic dielectrics. The dielectric material 18 can be porous or non-porous, with porous dielectrics having a dielectric constant of about 2.8 or less being highly preferred in some embodiments of the present invention. Some examples of suitable dielectrics that can be used as the dielectric material 18 include, but are not limited to: $SiO_2$, silsesquioxanes, C doped oxides (e.g., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 18 usually has a dielectric constant that is about 4.0 or less, with a dielectric constant of about 2.8 or less being more preferable. These dielectrics generally have a lower parasitic crosstalk as compared with dielectric materials that have a higher dielectric constant than 4.0. The dielectric constants mentioned herein are measured in a vacuum. The thickness of the dielectric material 18 can vary depending upon the dielectric material used as well as the exact number of dielectrics within the lower interconnect level M1. Usually, for regular interconnect structures, the dielectric material 18 can have a thickness from about 200 to about 450 nm.

Next, at least one via opening 20 can be formed by, e.g., forming a blanket hard mask (not shown) material atop the upper surface of the dielectric material 18. The blanket hard mask material includes an oxide, nitride, oxynitride or any combination including multilayers thereof. The hard mask material can be an oxide such as $SiO_2$ or a nitride such as $Si_3N_4$. The blanket hard mask material can be formed utilizing a conventional deposition process such as, for example, CVD, PECVD, chemical solution deposition or evaporation. The thickness of the as-deposited hard mask material can vary depending upon the type of hard mask material formed, the number of layers that make up the hard mask material and the deposition technique used in forming the same. Usually, the as-deposited hard mask material can have a thickness from about 10 to about 80 nm, with a thickness from about 20 to about 60 nm being more preferable.

After forming the blanket layer of hard mask material, a photoresist (not shown) is formed atop the hard mask material utilizing a conventional deposition process such as, for example, spin-on coating or chemical solution deposition. The photoresist can be a positive-tone material, a negative-tone material or a hybrid material, each of which is well known to those skilled in the art. The photoresist can then subjected to a lithographic process which includes exposing the photoresist to a pattern of radiation and developing the exposed resist utilizing a conventional resist developer. The lithographic step provides a patterned photoresist atop the hard mask material that defines the width of the via opening 20.

After providing the patterned photoresist, the via pattern can be transferred into the hard mask material and then subsequently into the dielectric material 18 utilizing one or more etching process. The patterned photoresist can be stripped immediately after the via pattern is transferred into the hard mask forming patterned hard mask utilizing a conventional stripping process. Alternatively, the patterned photoresist can be stripped after the via pattern is transferred into the dielectric material 18. The etching used in transferring the via pattern may include a dry etching process, a wet chemical etching process or a combination thereof. The term "dry etching" is used herein to denote an etching technique such as reactive-ion etching, ion beam etching, plasma etching or laser ablation.

After the via opening 20 is formed, a top surface 13 of the metal region 12 is exposed.

Figure 2:
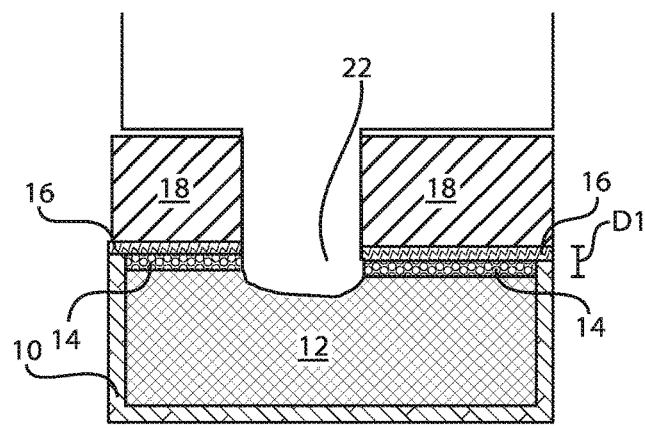
FIG. 2 is a cross-sectional view of the semiconductor structure of FIG. 1 where the metal-filled trench is recessed by a first amount, in accordance with an embodiment of the present invention.

FIG. 2 is a cross-sectional view of the semiconductor structure of FIG. 1 where the metal-filled trench is recessed by a first amount, in accordance with an embodiment of the present invention.

In various exemplary embodiments, the metal region 12 can be recessed by a first amount "D1." The recess 22 can have a substantially semi-circular shape. The recess 22 can have an asymmetrical or irregular shape. The recess 22 can be referred to as a divot or a gouge or a gouging feature. The gouging feature 22 can be referred to as an anchoring structure or anchored via bottom.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

In one example, the etching is an isotropic wet etch. The wet etching process can be performed by using diluted hydrogen peroxide ($H_2O_2$) or diluted ammonia ($NH_3OH$) and an $H_2O_2$ mixture. The etchants used in this wet etching process can include an oxidizing agent, such as, for example, hydrogen peroxide, which can oxidize metal structures, such as a metal hard mask (not shown), thereby facilitating its removal.

Figure 3:
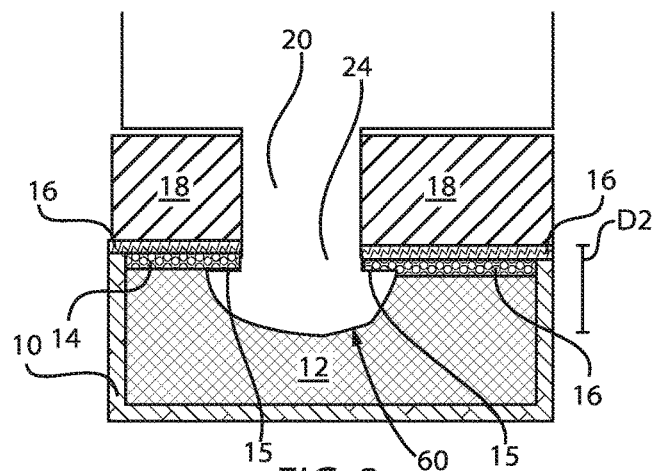
FIG. 3 is a cross-sectional view of the semiconductor device of FIG. 2 where the metal-filled trench is recessed by a second amount to expose a bottom surface of the noble metal cap (undercutting), in accordance with an embodiment of the present invention.

FIG. 3 is a cross-sectional view of the semiconductor device of FIG. 2 where the metal-filled trench is recessed by a second amount to expose a bottom surface of the noble metal cap (undercutting), in accordance with an embodiment of the present invention.

In various exemplary embodiments, the metal region 12 can be recessed by a second amount "D2." The recess 24 can have a substantially semi-circular shape. The recess 24 can have an asymmetrical or irregular shape. The recess 24 can be referred to as a divot or a gouge or a gouging feature. The gouging feature 24 can be referred to as an anchoring structure or anchored via bottom. The via anchoring structure can be designated as 60.

The recess 24 can be performed by a selective wet etch (isotropic) to the noble metal cap 14. In other words, the etch causes a portion or section of a bottom surface 15 of the noble metal cap 14 to be exposed. The etch does not cause any damage to the noble metal cap 14 (or if there is any damage, it is negligible). The metal wet etch thus creates gouging, including an under-cut, in the underlying metal region 12 in the first interconnect level M1. The gouging feature 60 is substantially aligned with the via opening 20.

Figure 4:
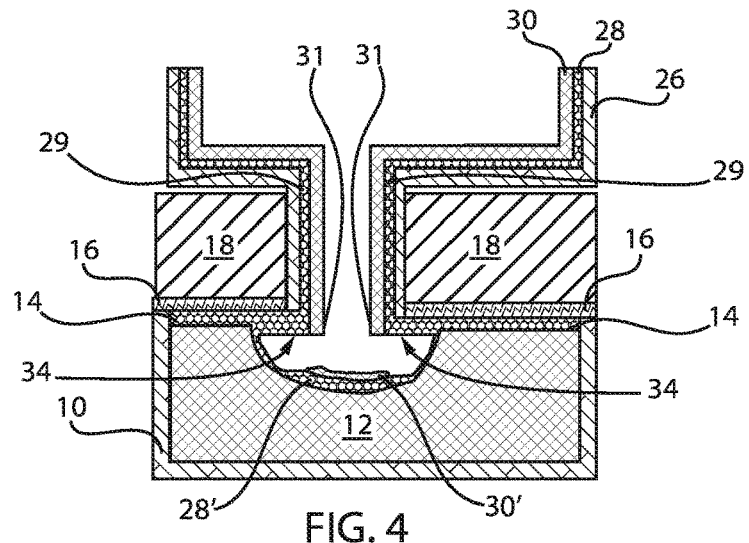
FIG. 4 is a cross-sectional view of the semiconductor device of FIG. 3 where a liner and seed are applied, in accordance with an embodiment of the present invention.

FIG. 4 is a cross-sectional view of the semiconductor device of FIG. 3 where a liner and seed are applied, in accordance with an embodiment of the present invention.

In various exemplary embodiments, liner/seed liner/seed layers 26, 28, 30 are deposited. A conductive liner 26 can be first deposited adjacent the dielectric material 18, adjacent a sidewall of the dielectric capping layer 16 and adjacent a sidewall of the noble metal cap 14. A first seed layer 28 can be formed over the conductive liner 26. A second seed layer 30 can be formed over the first seed layer 28. The conductive liner 26 can be, e.g., a tantalum nitride (TaN) liner 26. The first seed layer 28 can be, e.g., a noble metal seed layer 28. The second seed layer 30 can be, e.g., a metal layer 30. The metal layer 30 can be, e.g., a Cu layer.

The first seed layer 28 can extend around the edge of the conductive liner 26 and directly contact the noble metal cap 14 in region 34. In fact, the first seed layer 28 directly contacts and entire bottom surface of the noble metal cap 14 in region 34. Region 34 can be referred to as the undercut region. The term "undercut" can refer to spaces between the recessed metal region and the noble metal cap 14. Moreover, some first seed layer residue 28' may be present over the recessed metal region.

The second seed layer 30 extends and terminates along the vertical section 29 of the first seed layer 28. The edge of the second seed layer 30 is designated as 31. The second seed layer 30 does not cover the entirety of the first seed layer 28. In other words, deposition of the second seed layer 30 results in the undercut region 34 remaining exposed. Additionally, a small amount of residue 30' of the second seed layer 30 may be present within the recessed metal.

Moreover, it is noted that the noble metal cap 14 is continuous and plating current can go through. In other words, an electrical connection is maintained through the device/structure. Moreover, the plated metal layer 30 can grow successfully on the noble metal liner 28, even in the undercut area 34.

The liner/seed layers 26, 28, 30 can be constructed from a metal or metal alloy from Group VIIIA of the Periodic Table of Elements. Examples of suitable Group VIIIA elements for the adhesion/plating seed layer include, but are not limited to: Ru, TaRu, Ir, Rh, Pt, Pd and alloys thereof. In some embodiments, it is preferred to use Ru, Ir or Rh as the liners.

The liner/seed layers 26, 28, 30 can be formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the liner/seed layers 26, 28, 30 can vary depending on a number of factors including, for example, the compositional material of the liner/seed layers 26, 28, 30 and the technique that was used in forming the same. Usually, the liner/seed layers 26, 28, 30 each can have a thickness from about 0.5 to about 10 nm, with a thickness of less than 6 nm being preferable.

Figure 5:
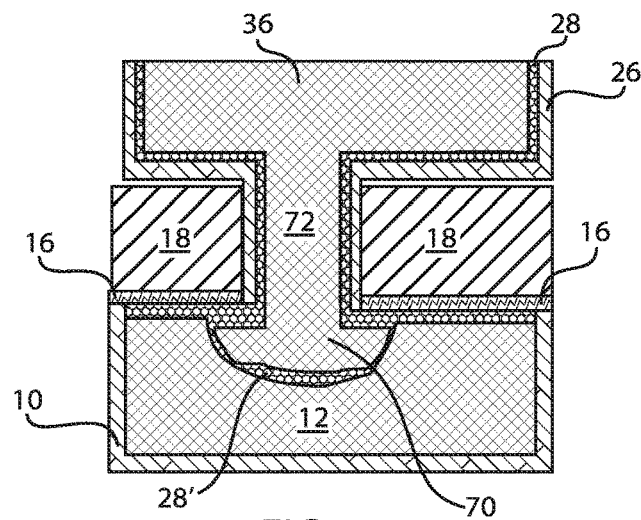
FIG. 5 is a cross-sectional view of the semiconductor device of FIG. 4 where a metal fill takes place, in accordance with an embodiment of the present invention.

FIG. 5 is a cross-sectional view of the semiconductor device of FIG. 4 where a metal fill takes place, in accordance with an embodiment of the present invention.

In various exemplary embodiments, a metal fill 36 takes place. The metal fill 36 can be, e.g., copper. The metal fill 36 results in an enlarged contact area 70 between the via 72 and the underlying metal region 12. As shown, no voids or gaps are present once the metal fill 36 takes place. In other words, the metal fill 36 covers or fills the entirety of the via bottom and extends all the way to the metal region 12. The contact area 70 between the via 72 and the underlying metal region 12 can be controlled by modulating or adjusting or manipulating the metal wet etch amount. As a result, a dual damascene structure can be created with a metal/noble metal/metal (e.g., Cu/Ru/Cu) interface disposed at the bottom of the via 72.

After deposition, a conventional planarization process such as, for example, chemical mechanical polishing (CMP) can be used to provide a structure in which the metal fill 36 each is substantially coplanar with the top edges of the liner/seed layers 26, 28, 30.

Figure 6:
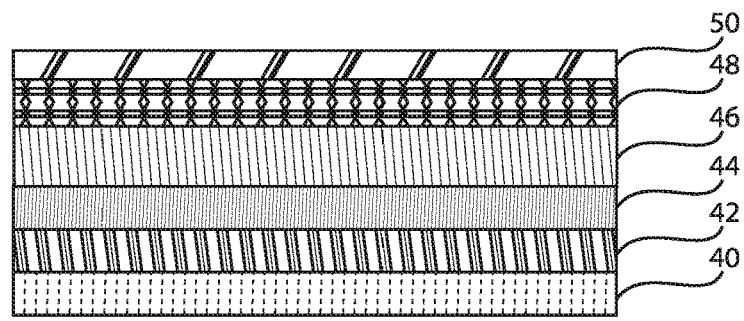
FIG. 6 is a cross-sectional view of a substrate stack depicting metal plating on a noble metal liner, in accordance with an embodiment of the present invention.

FIG. 6 is a cross-sectional view of a substrate stack depicting metal plating on a noble metal liner, in accordance with an embodiment of the present invention.

In various exemplary embodiments, a substrate stack is shown including metal plating on noble metal liner (e.g., a Ru liner). The substrate stack can include a substrate 40 and an oxide 42 formed over the substrate 40. The substrate 40 can be, e.g., a Si substrate and the oxide 42 can be, e.g., $SiO_2$. A conductive liner 44 can be formed over the oxide 42.

The conductive liner 44 can be, e.g., Ta/TaN. A metal plate 46 can then be formed over the conductive liner 44. The metal plate 46 can have a thickness of about 40 nm. A conductive layer 48 can then be formed over the metal plate 46. The conductive layer 48 can be, e.g., a Ta layer. Finally, a noble metal liner 50 can be formed over the conductive layer 48. The metal plating on noble metal liner substrate stack enables an enlarged contact area between the via and the metal region without any voids or gaps.

Therefore, a new and improved semiconductor interconnect structure can be created which includes a via gouging feature (via noble metal liner or noble metal cap), yet no profile damage is created in the interconnect dielectric material and no plating voids are created in the interconnect structure as well.

Figure 7:
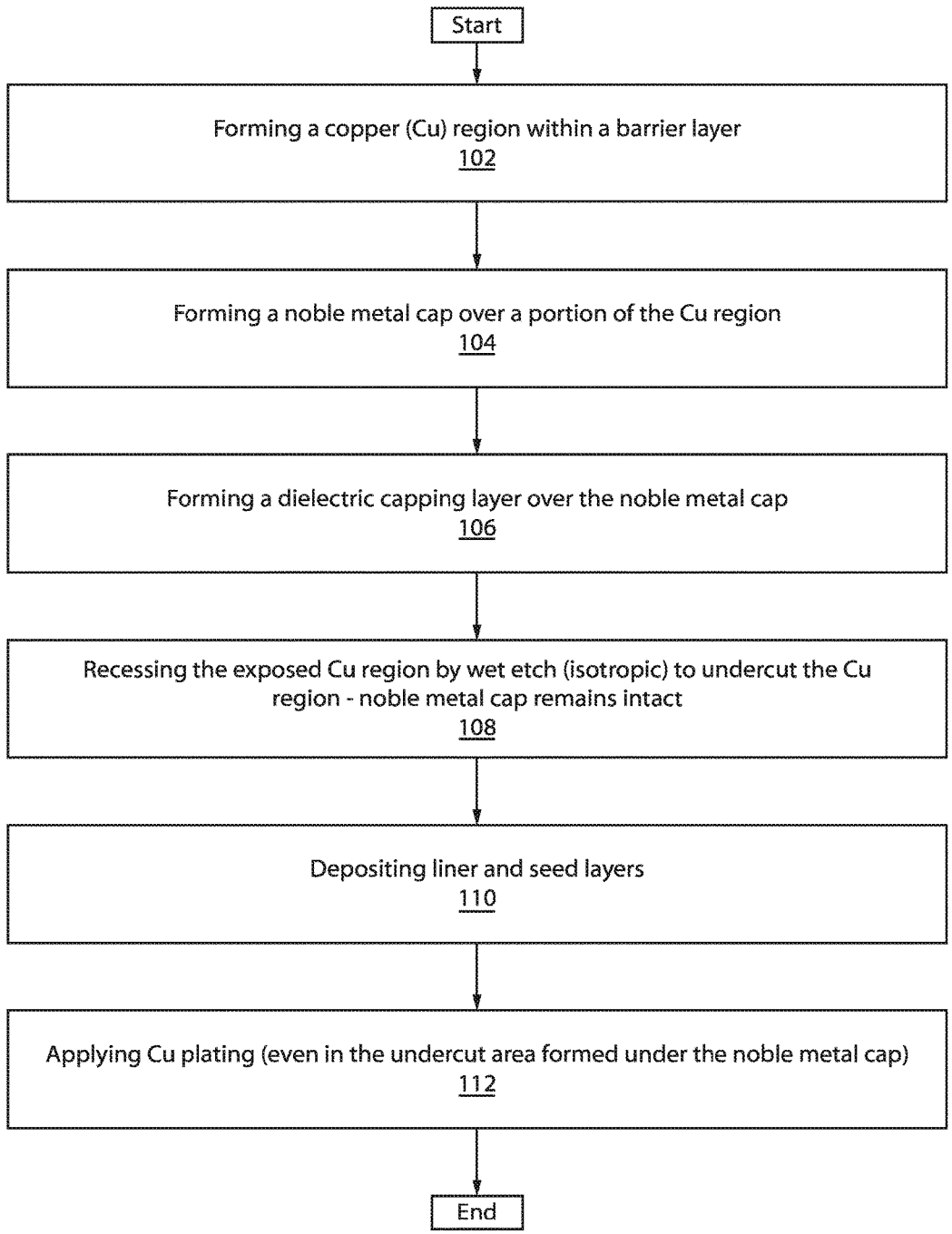
FIG. 7 is a block/flow diagram of an exemplary method for forming an enlarged contact area between a via and an underlying metal line without any voids, in accordance with an embodiment of the present invention.

FIG. 7 is a block/flow diagram of an exemplary method for forming an enlarged contact area between a via and an underlying metal line without any voids, in accordance with an embodiment of the present invention.

At block 102, a metal region can be formed within a barrier layer.

At block 104, a noble metal cap can be formed over a portion of the metal region. The noble metal cap can be, e.g., a ruthenium (Ru) cap. Noble metals are metals that are resistant to corrosion and oxidation in moist air. Noble metals that can be employed for forming the noble metal cap include at least ruthenium, rhodium, palladium, silver, osmium, iridium, platinum, and gold.

At block 106, a dielectric capping layer can be formed over the noble metal cap. The dielectric capping layer 16 includes any suitable dielectric capping material such as, for example, SiC, $Si_4NH_3$, $SiO_2$, a carbon doped oxide, a nitrogen and hydrogen doped silicon carbide SiC(N,H) or multilayers thereof.

At block 108, the exposed metal region can be recessed by wet etch (isotropic) to undercut the metal region, while the noble metal cap remains intact. The bottom surface of the noble metal cap remains partially exposed. The noble metal cap is not damaged by the recessed metal wet etch. The noble metal cap remains intact to create the via anchoring.

At block 110, a liner and seed layers are deposited. In one instance, a conductive liner is first deposited adjacent the dielectric material, adjacent a sidewall of the dielectric capping layer and adjacent a sidewall of the noble metal cap. A first seed layer can be formed over the conductive liner. A second seed layer can be formed over the first seed layer. The conductive liner can be, e.g., a tantalum nitride (TaN) liner. The first seed layer can be, e.g., a noble metal seed layer. The second seed layer can be, e.g., a metal layer. The noble metal cap is continuous and plating current can flow through the device.

At block 112, metal plating can be applied even in the undercut area formed under the noble metal cap. The metal fill results in an enlarged contact area between the via and the underlying metal region. No voids or gaps are present once the metal fill takes place. In other words, the metal fill covers or fills the entirety of the via bottom and extends all the way to the metal region. The contact area between the via and the underlying metal region can be controlled by modulating or adjusting the metal wet etch amount.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a structure and method for forming a noble metal cap between a via and an underlying metal line without any voids to create an enlarged contact area (which are intended to be illustrative and not limiting), it is noted that modifications and variations can be made by persons skilled in the art in light of the above teachings. It is therefore to be understood that changes can be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming an enlarged contact area, the method comprising:
   forming a trench for receiving a first conductive material;
   forming a noble metal cap over a portion of the first conductive material;
   forming a dielectric capping layer over the noble metal cap;
   etching a portion of the first conductive material to create a via anchoring structure and an undercut region exposing a bottom surface of the noble metal cap; and
   depositing a plurality of liners such that one liner of the plurality of liners directly contacts an entirety of the exposed bottom surface of the noble metal cap.

2. The method of claim 1, wherein the metal received within the trench is copper (Cu).

3. The method of claim 1, wherein the noble metal cap is a ruthenium (Ru) cap.

4. The method of claim 1, wherein the etching is an isotropic wet etch that prevents etching of the noble metal cap.

5. The method of claim 1, wherein the plurality of liners includes three layers.

6. The method of claim 5, wherein the first layer is a tantalum nitride (TaN) liner, the second layer is a ruthenium (Ru) liner, and the third layer is a copper (Cu) layer.

7. The method of claim 1, further comprising filling the undercut region with a second conductive material such that voids are prevented from forming between a via and the first conductive material.

8. A method for forming an enlarged contact area, the method comprising:
   depositing a first conductive material within a barrier layer;
   forming a ruthenium (Ru) cap over a portion of the first conductive material;
   etching a portion of the first conductive material;
   creating a via anchoring structure and an undercut region exposing a bottom surface of the Ru cap; and
   depositing a plurality of liners such at least one liner of the plurality of liners directly contacts the exposed bottom surface of the Ru cap such that plating current flows through the plurality of liners.

9. The method of claim 8, wherein the metal received within the barrier layer is copper (Cu).

10. The method of claim 8, wherein the etching is an isotropic wet etch that prevents etching of the Ru cap.

11. The method of claim 8, wherein the plurality of liners includes three layers.

12. The method of claim 11, wherein the first layer is a tantalum nitride (TaN) liner, the second layer is a ruthenium (Ru) liner, and the third layer is a copper (Cu) layer.

13. The method of claim 8, further comprising filling the undercut region with a second conductive material such that voids are prevented from forming between a via and the first conductive material.

14. A semiconductor structure forming an enlarged contact area, the structure comprising:
   a first conductive material disposed within a barrier layer;
   a noble metal cap disposed over a portion of the first conductive material;
   a via anchoring structure created by etching a portion of the first conductive material;
   an undercut region defined under the noble metal cap, the undercut region exposing a bottom surface of the noble metal cap; and
   a plurality of liners deposited such at least one liner of the plurality of liners directly contacts the exposed bottom surface of the noble metal cap.

15. The structure of claim 14, wherein the metal received within the barrier layer is copper (Cu).

16. The structure of claim 14, wherein the noble metal cap is a ruthenium (Ru) cap.

17. The structure of claim 14, wherein the plurality of liners includes three layers.

18. The structure of claim 17, wherein the first layer is a tantalum nitride (TaN) liner, the second layer is a ruthenium (Ru) liner, and the third layer is a copper (Cu) layer.

19. The structure of claim 14, wherein the undercut region is filled with a second conductive material such that voids formation is prevented between a via and the first conductive material.

20. The structure of claim 14, wherein plating current flows through the plurality of liners due to the noble metal cap directly contacting the at least one liner of the plurality of liners.

* * * * *